United States Patent [19]

Krautschneider et al.

[11] Patent Number: 5,646,883
[45] Date of Patent: Jul. 8, 1997

[54] SIGNAL SENSING CIRCUITS FOR MEMORY SYSTEM USING DYNAMIC GAIN MEMORY

[75] Inventors: Wolfgang Krautschneider, Burlington; Klaus J. Lau, Essex Junction, both of Vt.

[73] Assignee: Siemens Aktiengesellschaft, Munich, Germany

[21] Appl. No.: 708,913

[22] Filed: Sep. 5, 1996

Related U.S. Application Data

[63] Continuation of Ser. No. 295,366, Aug. 24, 1994, abandoned, which is a continuation of Ser. No. 994,736, Dec. 22, 1992, abandoned.

[51] Int. Cl.$^6$ .................................................. G11C 11/00
[52] U.S. Cl. .............................................. 365/156; 365/208
[58] Field of Search .................................. 365/154, 156, 365/190, 205, 207, 208; 327/51, 52, 63

[56] References Cited

U.S. PATENT DOCUMENTS

| | | | |
|---|---|---|---|
| 3,697,962 | 10/1972 | Beausoleil | 365/156 |
| 3,983,545 | 9/1976 | Cordaro | 365/156 |
| 4,114,055 | 9/1978 | Hollingsworth | 327/57 |
| 4,270,190 | 5/1981 | Jindra et al. | 365/208 |
| 4,286,178 | 8/1981 | Rao et al. | 327/57 |
| 4,321,492 | 3/1982 | Hollingsworth | 327/57 |
| 4,432,073 | 2/1984 | Masuoka | 365/182 |
| 4,459,497 | 7/1984 | Kuo et al. | 327/51 |
| 4,586,166 | 4/1986 | Shah | 364/154 |
| 4,627,033 | 12/1986 | Hyslop et al. | 365/205 |
| 4,821,232 | 4/1989 | Nakano | 365/190 |
| 4,864,374 | 9/1989 | Banerjee | 365/174 |
| 4,933,906 | 6/1990 | Terada et al. | 365/208 |
| 5,020,031 | 5/1991 | Miyatake | 365/203 |
| 5,040,146 | 8/1991 | Mattausch et al. | 365/154 |
| 5,083,295 | 1/1992 | Lammerts et al. | 365/205 |
| 5,089,726 | 2/1992 | Chappell et al. | 327/50 |
| 5,091,886 | 2/1992 | Miyawaki et al. | 365/204 |
| 5,127,739 | 7/1992 | Duvvury et al. | |
| 5,278,467 | 1/1994 | Nedwek | 307/530 |
| 5,289,415 | 2/1994 | DiMarco | 365/208 |

FOREIGN PATENT DOCUMENTS

| | | |
|---|---|---|
| 0505653 | 9/1992 | European Pat. Off. |

OTHER PUBLICATIONS

"Fully Scalable Gain Memory Cell for Future DRAMS", Krautschneider et al., Microelectronic Engineering, vol. 15, 1991, Amsterdam, NL, pp. 367–370.

*Primary Examiner*—A. Zarabian
*Attorney, Agent, or Firm*—Adel A. Ahmed

[57] ABSTRACT

A memory system includes a plurality of gain memory cells connected via bit bits to sense amplifiers with each sense amplifier having at least two pairs of metal oxide semiconductor (MOS) transistors which have opposite conductivity types. Each gain memory cell has two serially connected n-channel MOS transistors with a diode connected between a gate of a first of the transistors and a source thereof. Three illustrative embodiments of sense amplifiers are used with the gain memory cells.

7 Claims, 1 Drawing Sheet

5,646,883

SIGNAL SENSING CIRCUITS FOR MEMORY SYSTEM USING DYNAMIC GAIN MEMORY

CROSS-REFERENCE TO RELATED APPLICATION

This is a continuation of U.S. Ser. No. 08/295,366 filed Aug. 24, 1994, abandoned, which is a continuation of U.S. Ser. No. 07/994,736 filed Dec. 22, 1992, abandoned.

FIELD OF THE INVENTION

This invention relates to dynamic random access memory systems, and, more particularly, to signal sensing circuits (sense amplifiers) useful with dynamic gain memory cells.

BACKGROUND OF THE INVENTION

The basic memory cell typically used in megabit dynamic random access memories (DRAMS) is an n-channel metal oxide silicon (MOS) transistor having an output thereof connected to a capacitor with the transistor and capacitor both being formed in a common semiconductor body. This cell is typically known as a single transistor memory cell. In response to a need for larger and larger DRAMS, the single transistor memory cell has been reduced in size (i.e., scaled down) so as to facilitate a greater number of memory cells being formed in a given area of semiconductor material. One serious problem with this approach is that the amount of signal (charge) stored in this memory cell is a function of the physical size of the capacitor. As the cell is scaled down in size, the size of the capacitor is corresponding reduced and thus the capacitance thereof is reduced. One solution to this problem is the use of trench capacitors which are formed relatively deeply into the semiconductor body as so to increase the capacitance of the capacitor. As technology moves from 16 million bits of memory on a single integrated circuit chip to 64 million and then to 256 million, it becomes more and more difficult to provide the necessary minimum cell capacitance. Therefore, three dimensional structures, such as trench or stacked capacitors, are used as the storage capacitor. Furthermore, because of the tendency towards lower power supply voltages, the available output signals from the memory cells are corresponding reduced. This places higher and higher demands on sense amplifiers (signal sensing circuits) used with the memories which increases the physical size and electrical complexity thereof.

A new solution to the problem of size of the capacitor of the switched capacitor memory cell is the use of a gain memory cell of the type described in an article entitled "Fully Scalable Gain Memory Cell For Future DRAMS" by W. H. Krautschneider, L. Risch, K. Lau, and D. Schmitt-Landsiedel, published in Microelectronics Engineering Vol. 15 (1991), pages 367–370, which is incorporated herein by reference. The gain memory cell consists of first and second serially coupled MOS transistors with a diode coupled between the gate and source of the first transistor whose drain is coupled to a power supply having a voltage of +VDD. A gate of the second transistor is coupled to a control line which is denoted as a word line, and the source is coupled to a bit line. The drain of the second transistor is coupled to the source of the first transistor. It is to be appreciated that the output terminals, denoted as the drain and source, of an MOS transistor reverse as current flowing therethrough reverses. Logic information is stored in the gain memory cell as a function of charge on the gate of the first transistor. The first transistor is used as an amplifying device so that the output signal (i.e., charge from the cell) is much greater than the charge stored in the cell. This output charge (signal) is essentially being supplied from the power supply coupled to the drain of the first transistor. Accordingly, the output charge, and the corresponding generated voltage of a capacitor coupled to the bit line, increases. This generates a need for new and potentially less complex sense amplifiers (signal sensing circuits).

SUMMARY OF THE INVENTION

The present invention is directed to a memory system comprising a gain memory cell and a sense amplifier. The gain memory cell comprises first and second serially coupled field effect transistors each having first and second output terminals and a gate terminal, and means for coupling the first output terminal of the first transistor to the gate terminal thereof. The first output terminals of the first and second transistors are coupled together. The sense amplifier comprises first and second field effect transistors of a first conductivity type, and first and second field effect transistors of an opposite conductivity. The second output terminal of the second transistor of the gain memory cell is coupled to the first transistors of the sense amplifier. An output terminal of the sense amplifier is coupled to two of the transistors of the sense amplifier with these two transistors being of opposite conductivity types.

Viewed from another aspect, the present invention is directed to a memory system comprising a gain memory cell and a sense amplifier. The gain memory cell comprises first and second serially coupled field effect transistors each having first and second output terminals and a gate terminal, and means for coupling the first output terminal of the first transistor to the gate terminal thereof. The first output terminals of the first and second transistors are coupled together. The sense amplifier comprises first and second field effect transistors of a first conductivity type, and first and second field effect transistors of an opposite conductivity. Each of the transistors of the sense amplifier has first and second output terminals and a gate terminal. The second output terminal of the second transistor of the gain memory cell is coupled to an input terminal of the sense amplifier. The first output terminals of the first field effect transistors of the sense amplifier and the gate terminals of the second transistors of the sense amplifier are coupled to the input terminal of the sense amplifier. In the sense amplifier, the gate terminals of the first transistors are coupled to the first output terminals of the second transistors, and to a reference voltage terminal. An output terminal of the sense amplifier is coupled to the second output terminals of the first and second transistors of the opposite conductivity type of the sense amplifier. The second output terminals of the first transistors are coupled together; and the second output terminals of the second transistors are coupled together. The first transistor of the first conductivity type of the sense amplifier has a lower transconductance than the second transistor of first conductivity type such that if equal levels of voltage are applied to the input terminal and to the reference terminal of the sense amplifier, a predetermined output signal level is generated at the output terminal of the sense amplifier.

Viewed from still another aspect, the present invention is directed to a memory system comprising a gain memory cell and a sense amplifier. The gain memory cell comprises first and second serially coupled field effect transistors each having first and second output terminals and a gate terminal, and means for coupling the first output terminal of the first transistor to the gate terminal thereof. The first output terminals of the first and second transistors are coupled together. The sense amplifier comprises first, second, and third field effect transistors of a first conductivity type and first, second, and third field effect transistors of an opposite conductivity, each of the transistors of the sense amplifier has first and second output terminals and a gate terminal. The second output terminal of the second transistor of the gain memory cell is coupled to an input terminal of the sense amplifier. The gate terminals of the first field effect transistors of the sense amplifier and the first output terminals of the second transistors of the sense amplifier are coupled to the input terminal of the sense amplifier. In the sense amplifier, the first output terminals of the first transistors are coupled to the gates of the third transistors. The gates of the second transistors are adapted to be coupled to complementary signals. In the sense amplifier, an output terminal of the sense amplifier is coupled to the first output terminals of the third transistors, and to the second output terminals of the second transistors.

Viewed from still another aspect, the present invention is directed to a memory system comprising a gain memory cell and a sense amplifier. The gain memory cell comprises first and second serially coupled field effect transistors each having first and second output terminals and a gate terminal, and means for coupling the first output terminal of the first transistor to the gate terminal thereof. The first output terminals of the first and second transistors are coupled together. The sense amplifier comprises first and second field effect transistors of a first conductivity type, and first and second field effect transistors of an opposite conductivity, each of the transistors of the sense amplifier has first and second output terminals and a gate terminal, and further comprises transmission means for selectively coupling together an output terminal and an input terminal of the sense amplifier. The second output terminal of the second transistor of the gain memory cell is coupled to the input terminal of the sense amplifier. The gate terminals of the first field effect transistors of the sense amplifier and a first input/output terminal of the transmission means are coupled to the input terminal of the sense amplifier. In the sense amplifier, the first output terminals of the first transistors is coupled to the gates of the second transistors; and, the output terminal of the sense amplifier is coupled to a second input/output terminal of the transmission means and to the first output terminals of the second transistors.

Viewed from still another aspect, the present invention is directed to a memory system comprising a gain memory cell and a sense amplifier. The gain memory cell comprises first and second serially coupled field effect transistors each having first and second output terminals and a gate terminal, and means for coupling the first output terminal of the first transistor to the gate terminal thereof. The first output terminals of the first and second transistors are coupled together. The sense amplifier comprises first and second field effect transistors of a first conductivity type and first, second, and third field effect transistors of an opposite conductivity. Each of the transistors of the sense amplifier has first and second output terminals and a gate terminal. The second output terminal of the second transistor of the gain memory cell is coupled to an input terminal of the sense amplifier. The first output terminals of the first transistors of the sense amplifier and the gates of second transistors of the sense amplifier are coupled to the input terminal of the sense amplifier. In the sense amplifier, the gates of the first transistors are coupled to the first output terminal of the second transistor, to the first output terminal of the third transistor, and to an output terminal of the sense amplifier; and, a second output terminal of the first transistor of the opposite conductivity type is coupled to the first output terminal of the third transistor of the opposite conductivity type.

The invention may be more readily understood by reference to the following detailed description taken in conjunction with the accompanying drawings and claims.

DETAILED DESCRIPTION

Figure 1:
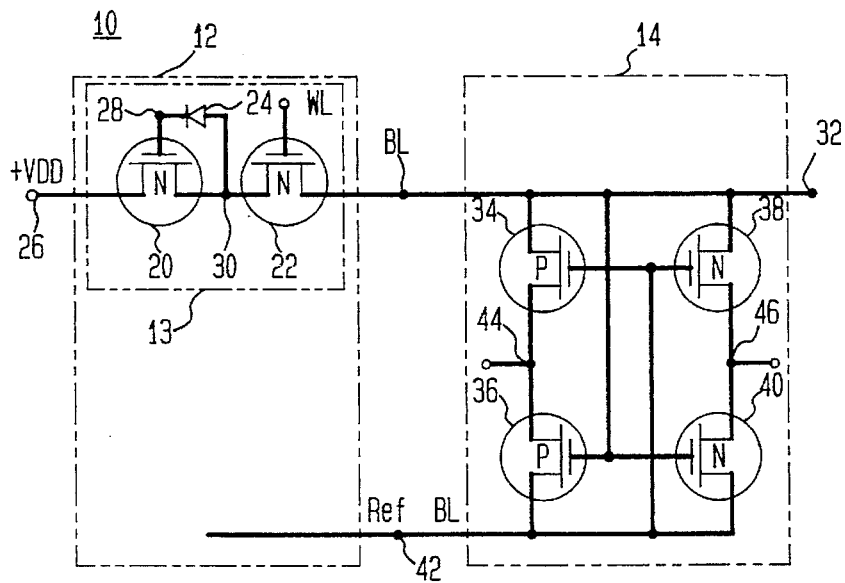
FIG. 1 shows portions of a memory system in accordance with the present invention.

Referring now to FIG. 1, there is shown portions of a dynamic memory system 10 in accordance with the present invention. Memory system 10 is a dynamic random access memory system (DRAM) which comprises a memory array 12, which includes a plurality of identical dynamic gain memory cells 13 (only one is shown within a dashed line rectangle) which are each coupled to a separate bit line BL, a reference bit line Ref BL, and a signal sensing circuit (sense amplifier) 14 (shown within a dashed line rectangle). Each memory cell 13 is essentially the same type of cell as is described an article entitled "Fully Scalable Gain Memory Cell For Future DRAMS" by W. H. Krautschneider, L. Risch, K. Lau, and D. Schmitt-Landsiedel, published in Microelectronics Engineering Vol. 15 (1991), pages 367–370, which is incorporated herein by reference. Each memory cell 13 comprises n-channel metal oxide semiconductor (MOS) transistors 20 and 22 and a diode 24. Signal sensing circuit 14 comprises p-channel MOS transistors 34 and 36 and n-channel MOS transistors 38 and 40. An n-channel MOS transistor may be denoted as being of n-type conductivity, and a p-channel MOS transistor may be denoted as being of p-type conductivity.

In memory cell 13, a drain of transistor 20 is coupled to a terminal 26 and to a power supply having an output voltage +VDD. A source of transistor 20 is coupled to a drain of transistor 22 and to an anode of diode 24. A cathode of diode 24 is coupled to a gate of transistor 20 and to a terminal 28. A gate of transistor 22 is coupled to a word line WL of the memory system 10. A source of transistor 22 is coupled to a terminal 32 which is coupled to the bit line BL.

The BL is coupled to drains of transistors 34 and 38, to gates of transistors 36 and 40, and to the terminal 32 which serves as an output of sense amplifier 14. The reference bit line Ref BL is coupled to a drain of transistor 36, to a source of transistor 40, to gates of transistors 34 and 38, and to a reference voltage terminal 42. Sources of transistors 34 and 36 are coupled to a terminal 44 which is coupled to a source of a first voltage pulse (not shown). Sources of transistors 38 and 40 are coupled to a terminal 46 which is coupled to a source of a second voltage pulse (not shown).

In operation, prior to sensing (detecting) information (the logic state) stored in one of memory cells 13, the bit line BL and reference bit line Ref BL are both discharged to VRef, which is in a typical embodiment is ground potential, and then allowed to electrically float at ground potential. At this time terminals 44 and 46, which had been held at ground potential, are allowed to electrically float in potential. The word line WL of a selected memory cell 13 is then activated, brought to a high level, a "1". If the selected memory cell 13 stores a "1", the potential of the bit line BL rises above ground while the potential of the reference bit line Ref BL continues to float in potential at ground. Terminals 44 and 46, which had been floating in potential, are pulsed in potential such that terminals 44 is at +VDD and terminal 46 is at ground (0 volts). In a typical embodiment +VDD=+3.3 volts. Current starts to flow in transistors 34 and 36, but more current flows through transistor 34 than through transistor 36 because of the difference in the gate-to-source voltage of the two transistors 34 and 36. This amplifies the voltage difference between BL and Ref BL and results in BL being set to the voltage (+VDD) applied to terminal 44, and leaves Ref BL at ground potential. This action is reinforced by transistors 38 and 40 with transistor 40 being biased on (enabled) and resulting in the 0 volts applied to terminal 46 being coupled to Ref BL and actively holding Ref BL at 0 volts.

If during readout of information from a memory cell 13 there is stored a "0" therein, then the BL and Ref BL are both at 0 volts. It is desired that for readout of a stored "0" that the BL stay low and that the Ref BL go high. This is accomplished by making the transconduction of transistor 36 higher than the transconductance of transistor 34. This results in the +VDD voltage applied to terminal 44 pulling up Ref BL faster than it pulls up BL. This biases off (disables) transistor 34 which allows B1 to stay at ground, a "0", while Ref BL goes to the voltage +VDD applied to terminal 44.

Figure 2:
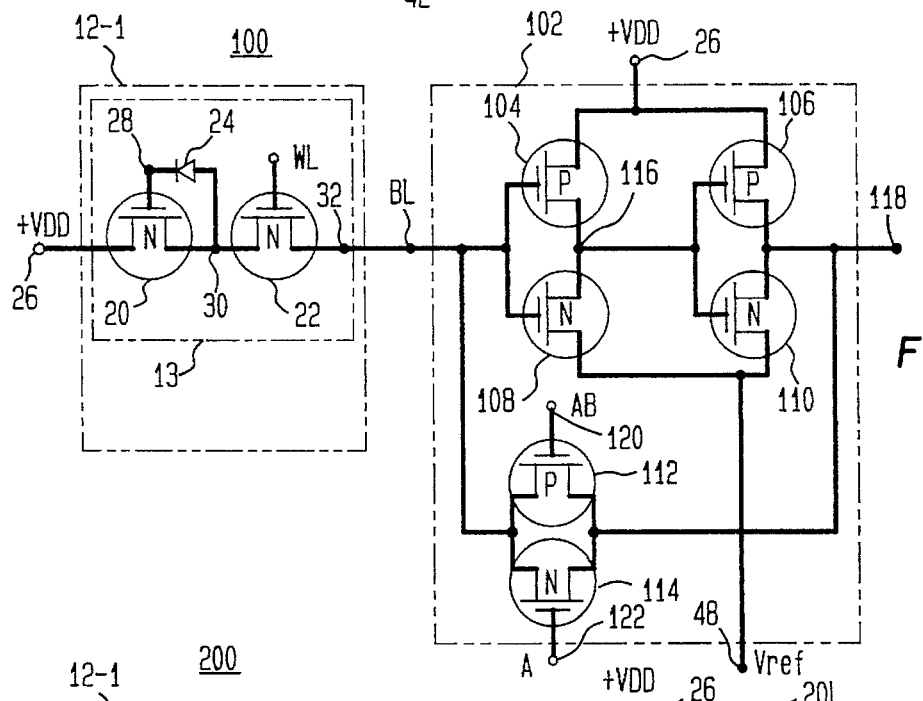
FIG. 2 shows portions of another memory system in accordance with the present invention.

Referring now to FIG. 2, there is shown portions of a dynamic memory system 100 in accordance with the present invention. Memory system 100 is a dynamic random access memory system (DRAM) which comprises a memory array 12-1, which includes plurality of identical dynamic gain memory cells 13 (only one is shown within a dashed line rectangle) which are each coupled to a separate bit line BL, and a signal sensing circuit (sense amplifier) 102 (shown within a dashed line rectangle). Each memory cell 13 is essentially the same type of cell as is described an article entitled "Fully Scalable Gain Memory Cell For Future DRAMS" by W. H. Krautschneider, L. Risch, K. Lau, and D. Schmitt-Landsiedel, published in Microelectronics Engineering 15 (1991), pages 367–370, which is incorporated herein by reference. Memory cell 13 comprises n-channel MOS transistors 20 and 22 and a diode 24. Signal sensing circuit (sense amplifier) 102 comprises p-channel MOS transistors 104, 106, and 112, and n-channel MOS transistors 108, 110, and 114. Memory array 12-1 is essentially identical to memory array 12 of FIG. 1 except there is no reference bit line.

The bit line BL is coupled to gates of transistors 104 and 108, to a drain of transistor 112, and to a source of transistor 114, and to terminal 32. Sources of transistors 104 and 106 are coupled together to a terminal 26 to which is coupled the power supply having the output voltage +VDD. Sources of transistors 108 and 110 are coupled to a terminal 48 which is coupled to a power supply having an output voltage Vref which is typically ground. Drains of transistors 104 and 108 are coupled to gates of transistors 106 and 110, and to a terminal 116. Drains of transistors 106 and 110 are coupled to a source of transistor 112, to a drain of transistor 114, and to an output terminal 118 of sense amplifier 102.

Transistors 112 and 114 are coupled together to form a transmission gate (also denoted as transmission means). A gate of transistor 114 is coupled to a terminal 122 which is shown coupled to a source (not shown) of a signal A. The gate of transistor 112 is coupled to a terminal 120 which is coupled to a source (not shown) of a signal AB which is the complement of signal A. With signal A at a high level, a "1", and signal AB at a low level, a "0", current can flow through the combination of transistors 112 and 114 and a "1" or a "0" can be transferred to BL and to terminal 32.

In operation, a read out of a stored "1" from memory cell 13 disables (biases off) transistor 104 and enables (biases on) transistor 108. This results in terminal 116 being pulled down to Vref, a low or "0" level. The "0" on terminal 116 enables transistor 106 and disables transistor 110. This results in +VDD, a high or a "1", on output terminal 118. Just after the read out operation of memory cell 13, the gate (terminal 122) of transistor 114, which has an A signal shown applied thereto, has a "1" applied thereto, and the gate (terminal 120) of transistor 112, which has an AB (the logical inverse of A) signal applied thereto, has a "0" applied thereto. These bias conditions on the gates of transistors 112 and 114 cause there to be a conduction path between terminals 118 (the output terminal of sense amplifier 102) and terminal 32 (the input terminal of sense amplifier 102). Accordingly, a "1" or a "0" on output terminal 118 is transferred to terminal 32 and held as a "1" or "0" even after the signal from memory cell 13 dissipates. This serves to maintain that same logic state at output terminal 118 after the logic signal from memory cell 13 is dissipated.

In order to achieve a low switching level, the magnitude of the threshold voltage (in absolute terms) of n-channel transistor 108 has to be much lower that the magnitude of the threshold voltage (in absolute terms) of p-channel transistor 114. This can be achieved by designing transistor 104 as a high threshold voltage device by omitting a counterdoping of the channel region thereof such that it is essentially a surface channel device. A further decrease of the switching point is possible by designing transistor 108 as a low threshold voltage device by an appropriate channel dopant concentration. Additionally, the switching point can be decreased by using a large channel width to channel length ratio for transistor 108 and a small channel width to length ratio for transistor 104.

In an illustrative embodiment of memory system 100 of FIG. 2, a stored "1" readout of gain memory cell 13 is about +0.5 volts, +VDD=+3.3 volts, Vref=0 volts, the threshold voltage (Vth) of transistors 106, 110, 112, and 114 are all about +0.7, or −0.7, respectively, the Vth of transistor 104 is −1.7 volts, and the Vth of transistor 108 is about +0.3 volts.

Figure 3:
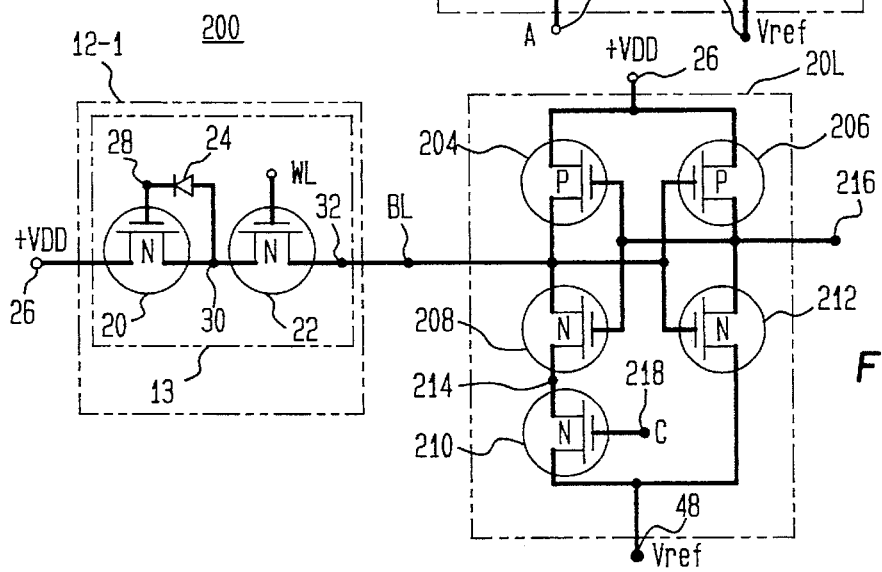
FIG. 3 shows portions of still another memory system in accordance with the present invention.

Referring now to FIG. 3, there is shown portions of a dynamic memory system 200 in accordance with the present invention. Memory system 200 is a dynamic random access memory system (DRAM) which comprises a memory array 12-1, which includes plurality of identical dynamic gain memory cells 13 (only one is shown within a dashed line rectangle) which are each coupled to a separate bit line BL, and a signal sensing circuit (sense amplifier) 202 (shown within a dashed line rectangle). Each memory cell 13 is essentially the same type of cell as is described an article entitled "Fully Scalable Gain Memory Cell For Future DRAMS" by W. H. Krautschneider, L. Risch, K. Lau, and D. Schmitt-Landsiedel, published in Microelectronics Engineering Vol. 15 (1991), pages 367–370, which is incorporated herein by reference. Memory cell 13 comprises n-channel MOS transistors 20 and 22 and a diode 24. Memory cells 13 of FIG. 3 are essentially identical to memory cells 13 of FIG. 2. Signal sensing circuit (sense amplifier) 202 comprises p-channel MOS transistors 204 and 206, and n-channel MOS transistors 208, 210, and 212.

The bit line BL is coupled to drains of transistors 204 and 208, to gates of transistors 206 and 212, and to terminal 32. Gates of transistors 204 and 208 are coupled to drains of transistors 206 and 212, and to an output terminal 216 of sense amplifier 202. A source of transistor 208 is coupled to a drain of transistor 210 and to a terminal 214. A gate terminal 218 of transistor 210 is coupled to a source (not shown) of a voltage waveform C which selectively enables (biases on) transistor 210.

In order to achieve a low switching level, the magnitude of the threshold voltage (in absolute terms) of n-channel transistor 212 has to be much lower that the magnitude of the threshold voltage (in absolute terms) of p-channel transistor 206. This can be achieved by designing transistor 206 as a high threshold voltage device by omitting a counterdoping of the channel region thereof such that it is essentially a surface channel device. A further decrease of the switching point is possible by designing transistor 212 as a low threshold voltage device by an appropriate channel dopant concentration. Additionally, the switching point can be decreased by using a large channel width to channel length ratio for transistor 212 and a small channel width to length ratio for transistor 206.

In an illustrative embodiment of memory system 200 of FIG. 3, a stored "1" readout of gain memory cell 13 is about +0.5 volts, +VDD=+3.3 volts, Vref=0 volts, the threshold voltage (Vth) of transistors 204, 208, and 210 are each about +0.7 volts, or −0.7 volts, respectively, the Vth of transistor 206 is −1.7 volts, and the Vth of transistor 212 is about 0.3 volts.

In operation, a logical "1" from memory cell 13 biases on (enables) transistor 212 and biases off (disables) transistor 206. This causes output terminal 216 to be pulled down to Vref which is typically zero volts, a logical "0". This condition enables transistor 204 and disables transistor 208. This results in terminal 32 being pulled up to +VDD, a high or logical "1". Accordingly, a high input signal, corresponding to a read out of a "1" stored in the memory cell 13 results in a "0" on output terminal 216. A logical "0" read out of memory cell 13 enables transistor 206 and disables transistor 212. This results in +VDD on terminal 216, a "1", which enables transistor 208 and disables transistor 204. It is noted that sense amplifier 202 provides at output terminal 216 an inversion of a logic signal stored in a memory cell 13. This inverted output signal is typically inverted in memory system 200 by another inverter (not shown). Just after a readout operation, after the BL has been set to ground potential and allowed to float at ground potential, transistor 210 is biased on by a high level being applied to gate terminal 218 by the voltage waveform C. Accordingly, terminal 32 is actively held at ground potential, a "0", by enabled transistors 208 and 210.

Although specific embodiments have been shown and described herein, these merely illustrate the principles of the present invention. Clearly, many varied arrangements embodying these principles may be devised by those skilled in the art without departing from the spirit and scope of the present invention. For example, the conductivity type of the transistors of the figures can be reversed with proper modifications to the power supply voltages and the voltage pulses used.

What is claimed is:

1. A memory system comprising:

a gain memory cell comprising first and second serially coupled field effect transistors each having first and second output terminals and a gate terminal, and means for coupling the first output terminal of the first transistor to the gate terminal thereof, the first output terminals of the first and second transistors being coupled together;

a sense amplifier comprising first, second, and third field effect transistors of a first conductivity type and first, second and third field effect transistors of an opposite conductivity, each of the transistors of the sense amplifier having first and second output terminals and a gate terminal, each of the first transistors being modified with one of a predetermined channel doping and a predetermined omission of channel counterdoping for achieving a greater difference in absolute threshold voltages between the first transistors;

the second output terminal of the second transistor of the gain memory cell being coupled to an input terminal of the sense amplifier;

the gate terminals of the first field effect transistors of the sense amplifier and the first output terminals of the second transistors of the sense amplifier being coupled to the input terminal of the sense amplifier;

in the sense amplifier, the first output terminals of the first transistors being coupled to the gates of the third transistors;

the gates of the second transistors being adapted to be coupled to complementary signals; and, in the sense amplifier, an output terminal of the sense amplifier being coupled to the first output terminals of the third transistors, and to the second output terminals of the second transistors.

2. The memory system of claim 1, wherein in the sense amplifier a greater difference in absolute threshold voltages between each of the first transistors is further achieved by using for each of the first transistors one of a predetermined large channel width to channel length ratio and a predetermined small channel width to channel length ratio.

3. The memory system of claim 2 wherein in the sense amplifier the second output terminals of the first and third transistors of the first conductivity type are coupled to a first power supply terminal, and the second output terminals of the first and third transistors of the opposite conductivity type are coupled to a second power supply terminal, and wherein the second output of the first transistor of the gain memory cell is coupled to a third power supply terminal.

4. The memory system of claim 3, wherein the first conductivity type is p-type conductivity and the opposite conductivity type is n-type conductivity, the p-type first transistor having a threshold voltage of −1.7 volts and the n-type first transistor having a threshold of +0.3 volts.

5. The memory system of claim 4 wherein the transistors of the sense amplifier are all metal oxide semiconductor transistors.

6. The memory system of claim 5 wherein the transistors of the gain memory cell are all of n-type conductivity.

7. A memory system comprising:

a gain memory cell comprising first and second serially coupled field effect transistors each having first and second output terminals and a gate terminal, and means for coupling the first output terminal of the first transistor to the gate terminal thereof, the first output terminals of the first and second transistors being coupled together;

a sense amplifier comprising first and second field effect transistors of a first conductivity type and first and second field effect transistors of an opposite conductivity, each of the transistors of the sense amplifier having first and second output terminals and a gate terminal, and comprising transmission means for selectively coupling together an output terminal and an input terminal of the sense amplifier, each of the first transistors being modified with one of a predetermined channel doping and a predetermined omission of channel counterdoping and having one of a predetermined large channel width to channel length ratio and a predetermined small channel width to channel length ratio for achieving a greater difference in absolute threshold voltages between the first transistors;

the second output terminal of the second transistor of the gain memory cell being coupled to the input terminal of the sense amplifier;

the gate terminals of the first field effect transistors of the sense amplifier and a first input/output terminal of the transmission means being coupled to the input terminal of the sense amplifier;

in the sense amplifier, the first output terminals of the first transistors being coupled to the gate of the second transistors; and, in the sense amplifier, the output terminal of the sense amplifier being coupled to a second input/output terminal of the transmission means and to the first output terminals of the second transistors, the second output terminals of the first field effect transistors being coupled together and to a potential and the second output terminals of the second field effect transistors being coupled together and to another potential substantially lower than said potential.

* * * * *